(12) United States Patent
Almoric et al.

(10) Patent No.: US 7,756,170 B2
(45) Date of Patent: Jul. 13, 2010

(54) FREQUENCY MODULATION IN THE OPTICAL ALIGNMENT OF WAVELENGTH-CONVERTED LASER SOURCES

(75) Inventors: Etienne Almoric, Corning, NY (US); Vikram Bhatia, Painted Post, NY (US); Jacques Gollier, Painted Post, NY (US); Dragan Pikula, Horseheads, NY (US); Daniel Ohen Ricketts, Corning, NY (US)

(73) Assignee: Corning Incorporated, Corning, NY (US)

( * ) Notice: Subject to any disclaimer, the term of this patent is extended or adjusted under 35 U.S.C. 154(b) by 194 days.

(21) Appl. No.: 11/880,386

(22) Filed: Jul. 20, 2007

(65) Prior Publication Data

US 2009/0022188 A1 Jan. 22, 2009

(51) Int. Cl.
*H01S 3/13* (2006.01)
(52) U.S. Cl. ............ 372/29.014; 372/21; 372/22
(58) Field of Classification Search ............ 372/29.014, 372/21, 22
See application file for complete search history.

(56) References Cited

U.S. PATENT DOCUMENTS

| | | | |
|---|---|---|---|
| 5,216,729 A | 6/1993 | Berger et al. | 385/31 |
| 6,178,188 B1 | 1/2001 | Jing et al. | 372/36 |
| 7,457,031 B1 * | 11/2008 | Gollier | 359/326 |
| 2004/0086018 A1 | 5/2004 | Caprara et al. | 372/70 |
| 2005/0081397 A1 | 4/2005 | Bonham et al. | 33/645 |
| 2005/0226285 A1 * | 10/2005 | Sakata et al. | 372/22 |
| 2005/0254532 A1 | 11/2005 | Van Saarloos | 372/24 |
| 2006/0092993 A1 * | 5/2006 | Frankel | 372/18 |
| 2006/0131124 A1 | 6/2006 | Chabinyc et al. | 192/105 |
| 2006/0165137 A1 | 7/2006 | Kachanov et al. | 372/21 |
| 2007/0091411 A1 * | 4/2007 | Mori et al. | 359/239 |
| 2008/0019702 A1 | 1/2008 | Shibatani et al. | 398/182 |
| 2008/0175282 A1 * | 7/2008 | Okuno et al. | 372/21 |

FOREIGN PATENT DOCUMENTS

| | | |
|---|---|---|
| JP | 2003-338795 | 11/2003 |
| WO | WO 2005076066 A1 * | 8/2005 |

OTHER PUBLICATIONS

"Modulation-free control of a continuous-wave second-harmonic generator", D. A. Shaddock, et al. J. Opt. A: Pure Appl. Opt. 2 (2000) 400-404.
Database accession No. 5348790 "Compact SHG green lasers" The Institution of Electrical Engeineers, Stevenage, GB 19976.

* cited by examiner

*Primary Examiner*—Minsun Harvey
*Assistant Examiner*—Joshua King
(74) *Attorney, Agent, or Firm*—Kwadjo Aduse I-Poku

(57) ABSTRACT

Methods of controlling semiconductor lasers are provided where the semiconductor laser generates a wavelength-modulated output beam $\lambda_{MOD}$ that is directed towards the input face of a wavelength conversion device. The intensity of a wavelength-converted output $\lambda_{CONV}$ of the device is monitored as the output beam of the laser is modulated and as the position of the modulated output beam $\lambda_{MOD}$ on the input face of the wavelength conversion device is varied. A maximum value of the monitored intensity is correlated with optimum coordinates representing the position of the modulated output beam $\lambda_{MOD}$ on the input face of the wavelength conversion device. The optical package is operated in the data projection mode by directing an intensity-modulated laser beam from the semiconductor laser to the wavelength conversion device using the optimum positional coordinates. Additional embodiments are disclosed and claimed. Laser controllers and projections systems are also provided.

19 Claims, 4 Drawing Sheets

FREQUENCY MODULATION IN THE OPTICAL ALIGNMENT OF WAVELENGTH-CONVERTED LASER SOURCES

SUMMARY OF THE INVENTION

The present invention relates generally to semiconductor lasers, laser controllers, laser projection systems, and other optical systems incorporating semiconductor lasers. More particularly, by way of illustration and not limitation, embodiments of the present invention relate generally to optical alignment in packages that include, inter alia, a semiconductor laser and a second harmonic generation (SHG) crystal or another type of wavelength conversion device.

Short wavelength light sources can be formed by combining a single-wavelength, relatively long semiconductor laser, such as an infrared or near-infrared distributed feedback (DFB) laser, distributed Bragg reflector (DBR) laser, or Fabry-Perot laser, with a light wavelength conversion device, such as a second harmonic generation (SHG) crystal. Typically, the SHG crystal is used to generate higher harmonic waves of the fundamental laser signal. To do so, the lasing wavelength is preferably tuned to the spectral center of the wavelength converting SHG crystal and the output of the laser is preferably aligned with the waveguide portion at the input face of the wavelength converting crystal.

Mode diameters of typical SHG crystals, such as MgO-doped periodically poled lithium niobate (PPLN) crystals, can be in the range of a few microns. As a result, the present inventors have recognized that it can be very challenging to align the beam from the laser diode and the waveguide of the SHG crystal properly. Accordingly, one object of the present invention is to provide alignment methods and corresponding optical designs for optical packages that utilize SHG crystals or other types of wavelength conversion devices to generate shorter wavelength radiation (e.g., green laser light) from a longer wavelength source (e.g., a near-infrared laser diode).

According to one embodiment of the present invention, a method of controlling an optical package is provided. According to the method, the semiconductor laser generates a wavelength-modulated output beam $\lambda_{MOD}$ that is directed towards the input face of a wavelength conversion device. The intensity of a wavelength-converted output $\lambda_{CONV}$ of the device is monitored as the output beam of the laser is modulated and as the position of the modulated output beam $\lambda_{MOD}$ on the input face of the wavelength conversion device is varied. A maximum value of the monitored intensity is correlated with optimum coordinates representing the position of the modulated output beam $\lambda_{MOD}$ on the input face of the wavelength conversion device. The optical package is operated in the data projection mode by directing an intensity-modulated laser beam from the semiconductor laser to the wavelength conversion device using the optimum positional coordinates.

Additional embodiments of the present invention relate to maintaining alignment over time in optical packages utilizing wavelength conversion devices. More specifically, embodiments of the present invention are well-suited for maintaining alignment where changes in device temperature or changes in structural properties of the package components over time can lead to package misalignment. These aspects of the present invention generally involve monitoring for peak alignment during actual projection or at package start-up. As is discussed below with reference to FIG. 2, if alignment is to be monitored during projection, the intensity of the wavelength-converted output $\lambda_{CONV}$ of the device can be monitored during projector fly-back time or at other periods where the intensity-modulated laser beam is not carrying projection data, i.e., during relatively low intensity periods of the intensity-modulated laser beam. The present invention also contemplates routines for monitoring alignment when the intensity-modulated laser beam is carrying projection data, i.e., without reliance on the aforementioned low intensity fly-back periods of the intensity-modulated laser beam.

Still further embodiments of the present invention relate to laser projection systems and laser controllers programmed to operate semiconductor lasers according to the concepts of the present invention. It is contemplated that various concepts of the present invention will be applicable to color image-forming laser projection systems, laser-based displays such as heads-up displays in automobiles, or any laser application where optical alignment and/or wavelength tuning are issues. It is further contemplated that the control schemes discussed herein will have utility in a variety of types of semiconductor lasers, including but not limited to DBR and DFB lasers, Fabry-Perot lasers, and many types of external cavity lasers. Finally, it is contemplated that the various embodiment of the present invention, where adjustable optical components are configured to enable the aforementioned alignment accuracy, will permit construction and assembly of optical packages with increased ease and at substantially lower cost because they can allow for the elimination of some relatively intensive alignment procedures typically used in device assembly.

BRIEF DESCRIPTION OF THE DRAWINGS

The following detailed description of specific embodiments of the present invention can be best understood when read in conjunction with the following drawings, where like structure is indicated with like reference numerals and in which.

DETAILED DESCRIPTION

Although the general structure of the various types of optical packages in which the concepts of particular embodiments of the present invention can be incorporated is taught in readily available technical literature relating to the design and fabrication of frequency or wavelength-converted semiconductor laser sources, the concepts of particular embodiments of the present invention may be conveniently illustrated with general reference to an optical package including, for example, a DBR-type near-infrared semiconductor laser and a frequency-doubling PPLN SHG crystal. In such a configuration, the near infrared light emitted by the semiconductor laser is either directly coupled into the waveguide of the SHG wavelength conversion device or is coupled into the waveguide through collimating and focusing optics or some other type of suitable optical element or optical system. The wavelength conversion device converts the incident near-infrared light into frequency-doubled green laser light if the input beam is properly aligned and tuned. More generally, this type of configuration is particularly useful in generating a variety of shorter wavelength laser beams from a variety of longer wavelength semiconductor lasers and can be used, for example, as visible laser sources for laser projection systems.

Figure 1:
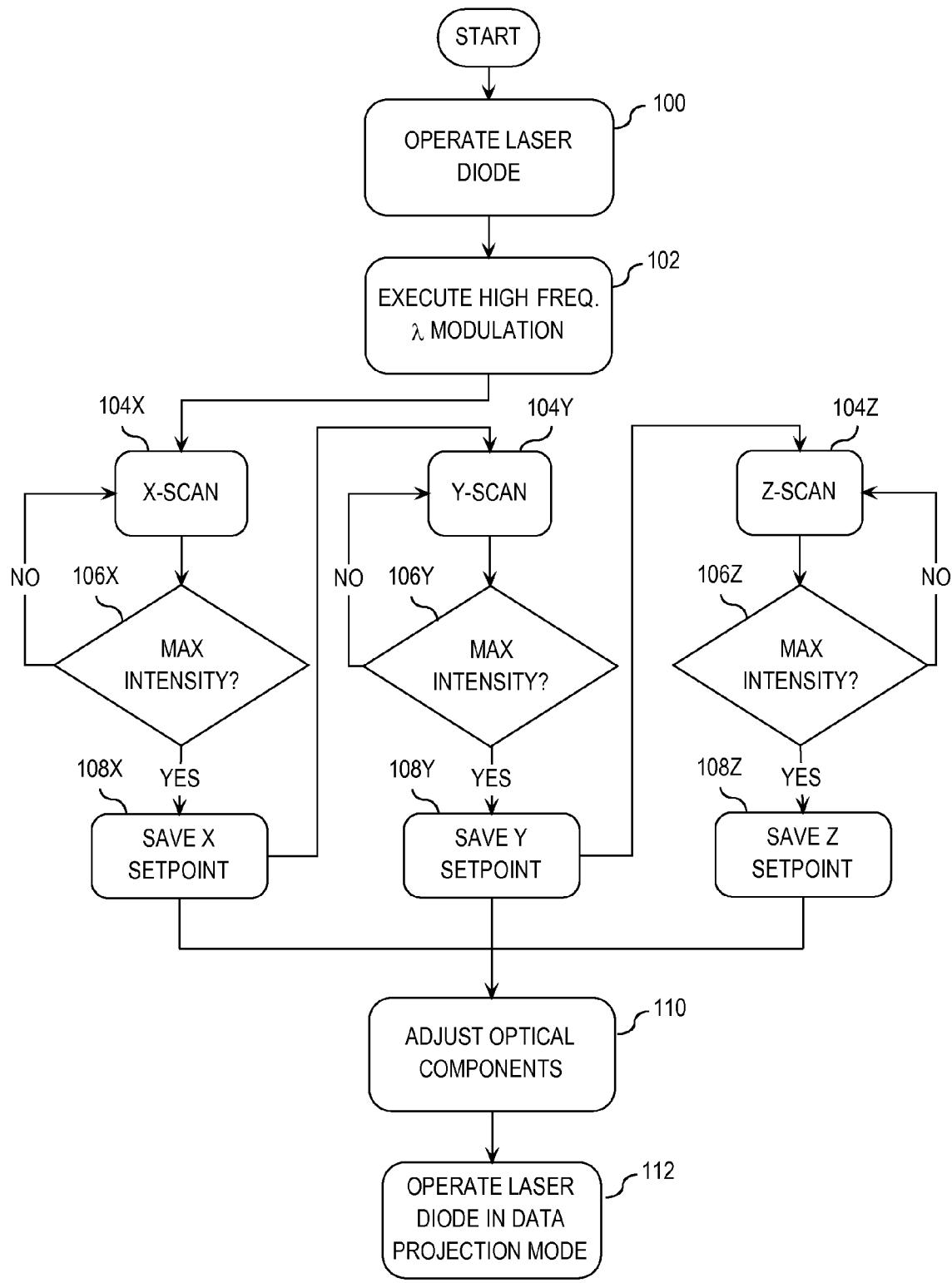
FIG. 1 is a flow chart illustrating a start-up or corrective alignment procedure according to one aspect of the present invention.
Figure 3:
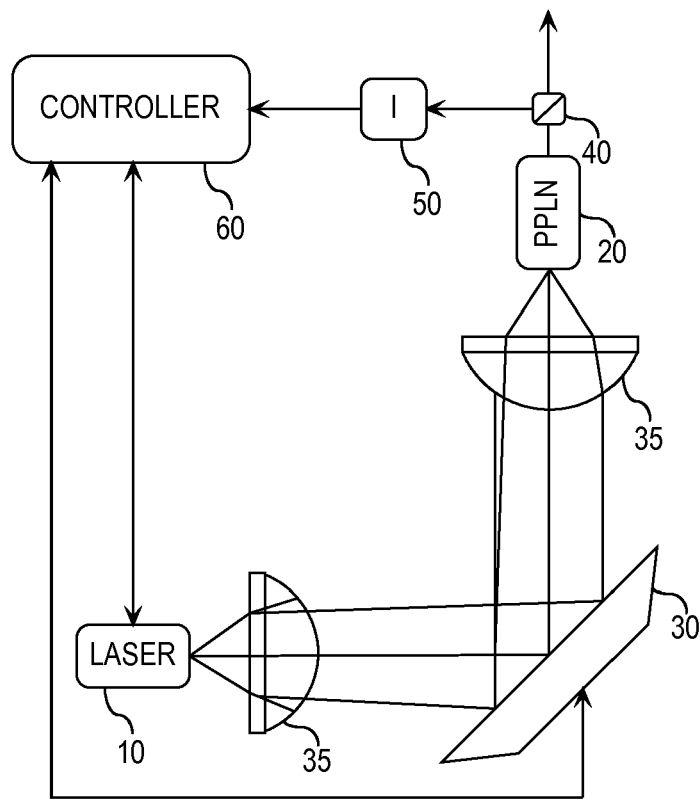
FIG. 3 is a schematic illustration of a MEMS mirror-enabled optical alignment package according to one embodiment of the present invention.

According to the embodiment of the present invention illustrated in the flow chart of FIG. 1 and the schematic of FIG. 3, an optical package is provided comprising a semiconductor laser 10, a wavelength conversion device 20, one or more adjustable optical components 30, lens elements 35, a beam splitter or suitable optical filter 40, an intensity sensor 50, and a programmable controller 60. The adjustable optical components 30 are configured to couple the optical output of the semiconductor laser 10 with an optical input face of the wavelength conversion device 20. The splitter/filter 40, intensity sensor 50, and the programmable controller 60 cooperate to monitor the intensity of a wavelength-converted output $\lambda_{CONV}$ of the wavelength conversion device 20.

FIG. 3 illustrates a splitter/filter 40 and an intensity sensor 50 configured to monitor intensity at the output of the wavelength conversion device 20. It is contemplated that the splitter/filter 40 can be configured to permit intensity monitoring at the native wavelength of the semiconductor laser 10 (e.g., in the IR or near-IR), at the converted wavelength of the wavelength conversion device 20 (e.g., in the visible spectrum), or both. In many cases it will be desirable to monitor intensity at the native wavelength of the semiconductor laser 10 because the conversion efficiency of the wavelength conversion device 20 never reaches 100% so there will always be a minimum native signal at the output of the wavelength conversion device 20 that can be used for monitoring regardless of whether the native wavelength falls within the wavelength conversion bandwidth of the wavelength conversion device 20. Unfortunately, in many cases, the use of IR monitoring alone may not be accurate enough. For example, some of the light that is not coupled into the wavelength conversion device 20 can generate stray light that may be partially detected by the monitoring system making the signal unusable. Another source of signal confusion can result from IR coupling into some of the modes that are supported by the wavelength conversion device 20. Accordingly, using the IR signal can lead to optimized coupling but may not guarantee optimum coupling. As a consequence, in many cases it may be preferable to monitor the intensity of the wavelength-converted output of the wavelength conversion device 20 by, for example, introducing a spectral filter into the optical path downstream of the wavelength conversion device 20. In this case, care should be taken to ensure that the wavelength of the semiconductor laser 10 is correctly adjusted. Otherwise, the conversion efficiency of the wavelength conversion device 20 can be extremely low and can lead to situations where there is no signal at the output of the wavelength conversion device 20 for use in alignment.

According to the method of the present invention illustrated in FIG. 1, the optical package is controlled by operating the semiconductor laser 10 to generate a wavelength-modulated output beam $\lambda_{MOD}$ that is modulated over a range of wavelengths encompassing a substantial portion of a FWHM conversion efficiency bandwidth of the wavelength conversion device 20 (see steps 100, 102). The modulated output beam $\lambda_{MOD}$ is directed towards the input face of the wavelength conversion device 20 and the adjustable optical components 30 are adjusted to vary the position of the modulated output beam $\lambda_{MOD}$ on the input face of the wavelength conversion device 20 (see steps 104X, 104Y, 104Z). In the illustrated example, the position of the modulated output beam $\lambda_{MOD}$ on the input face of the wavelength conversion device 20 is varied in the X, Y, and Z dimensions, where the X and Y components represent the position of the modulated output beam $\lambda_{MOD}$ in the plane of the input face, while the Z component represents the focus of the output beam $\lambda_{MOD}$ in the plane of the input face.

The intensity of the wavelength-converted output $\lambda_{CONV}$ of the wavelength conversion device is monitored as the output beam of the laser 10 is modulated and as the position of the modulated output beam $\lambda_{MOD}$ on the input face of the wavelength conversion device 20 is varied (see steps 106X, 106Y, 106Z). Because the output beam is modulated over a range of wavelengths, at a relatively high frequency, e.g., about 10 kHz, the wavelength of the laser will match, or nearly match, the conversion efficiency bandwidth of the wavelength conversion device 20 for at least a portion of the modulation cycle and therefore generate a significant quantity of statistically significant wavelength-converted light. For example, in the case of an infrared laser coupled to a PPLN SHG crystal, if the spectral bandwidth of the PPLN frequency doubling crystal is 0.2 nm and the uncertainty of the laser to PPLN matching wavelength is 2 nm, modulation of the laser wavelength with a 2 nm amplitude will insure wavelength matching and generation of green laser light for at least 10% of the time.

Figure 4:
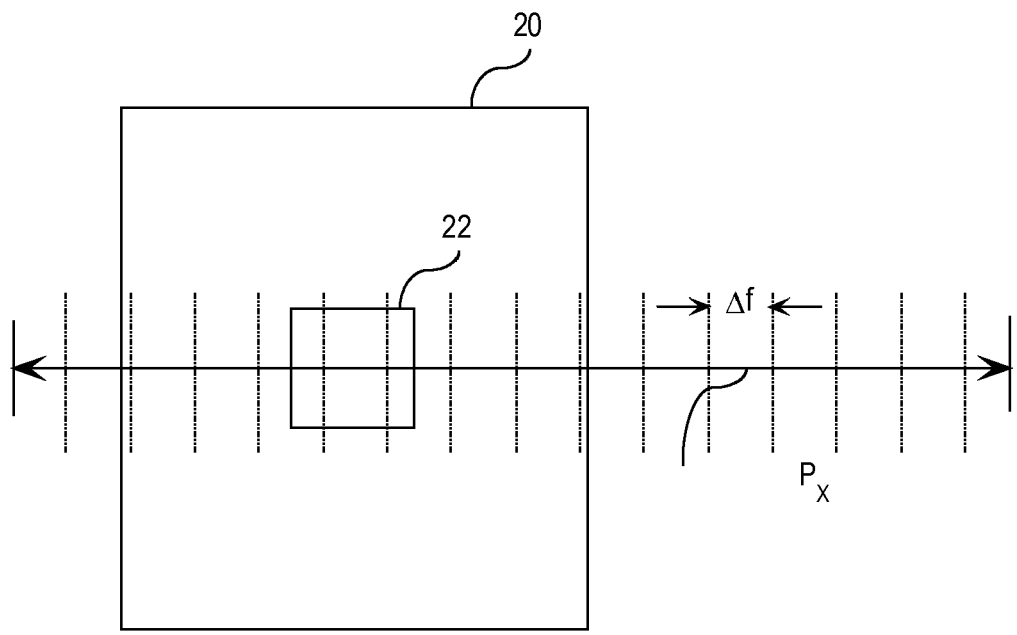
FIG. 4 illustrates a one-dimensional scanning path of a laser output beam in relation to a waveguide portion of a wavelength conversion device.
Figure 5:
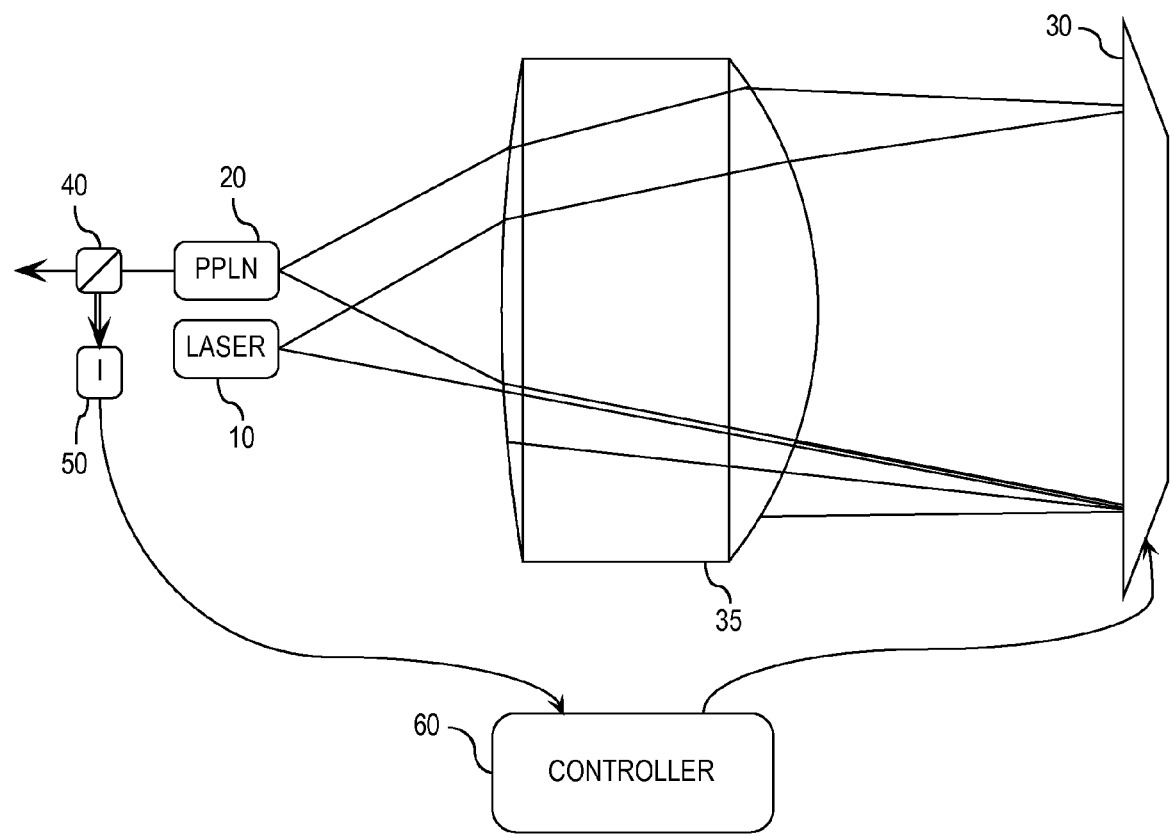
FIG. 5 is a schematic illustration of a MEMS mirror-enabled optical alignment package comprising a micro-opto-electromechanical mirror and lens or lens assembly configured to provide a folded-path optical system.

Referring to FIG. 4, a one-dimensional scanning path $P_x$ of a laser output beam is illustrated in relation to the waveguide portion 22 of the input face of the wavelength conversion device 20. In practicing the present invention, care should be taken to ensure that the frequency at which the output beam of the laser 10 is modulated is significantly greater than the frequency at which the output beam is scanned across the waveguide portion 22 of the input face of the wavelength conversion device 20. If not, the various alignment routines illustrated herein would be significantly less efficient and more difficult to execute because the scanned output beam of the laser 10 would, in many cases, need to cross the waveguide portion 22 of the wavelength conversion device 20 a number of times before the wavelength of the laser output would fall within the wavelength conversion bandwidth of the wavelength conversion device 20. Preferably, the frequency at which the output beam of the laser 10 is modulated should be high enough to ensure that the output beam cycles through the complete modulation frequency range $\Delta f$ at least once for each pass across the waveguide portion 22 of the wavelength conversion device 20.

Another aspect to be considered for green light monitoring is that, when the system is misaligned, most of the power that is collected at the output of the PPLN is IR stray light that propagates into the PPLN crystal without being coupled into the waveguide. This uncoupled IR stray light is collected by the sensor 50 and can then make the signal very confusing with some secondary maxima, making the use of IR as a monitor for the alignment difficult to use. However, in modulating the wavelength of the laser, only the green, wavelength-converted light is modulated at the output of the wavelength conversion device 20. As a result, a suitable electronic or other type of filter can be incorporated in the controller 60 or elsewhere to reject the native IR signal because only the wavelength-converted signal is modulated. Accordingly, the wavelength modulation aspects of the present invention also provide a convenient means to separate visible and IR components of a detected signal, an advantage that would be particularly beneficial when using a detector that may have compromised rejection of IR.

the illustrated embodiment, the maximum value of the monitored intensity of the wavelength-converted output $\lambda_{CONV}$ is first correlated with the X component of the optimum position coordinates and saved as an X setpoint (see steps 106X, 108X). Subsequently, the maximum value of the monitored intensity of the wavelength-converted output $\lambda_{CONV}$ is correlated with the Y component of the optimum position coordinates and saved as a Y setpoint (see steps 106Y, 108Y). Once the beam is properly aligned on the face of the wavelength conversion device 20, the maximum value of the monitored intensity of the wavelength-converted output $\lambda_{CONV}$ is correlated with the proper Z component of the optimum position coordinates and saved as a focus setpoint in the Z dimension (see steps 106Z, 108Z).

In this manner, the detected intensity data can be used to correlate a maximum intensity value with optimum coordinates representing the position and focus of the modulated output beam $\lambda_{MOD}$ on the input face of the wavelength conversion device 20. Once this correlation is completed, the positional variation of the modulated output beam $\lambda_{MOD}$ on the input face of the wavelength conversion device 20 is terminated by using the optimum coordinates to adjust the optical components 30 and operate the laser in 10 in a data projection mode (see steps 110, 112). The optical components 30 are also designed to permit subsequent X-Y-Z adjustment as the need arises. In operation, the optical components may be adjusted in the respective X, Y, and Z dimensions simultaneously or as each setpoint is saved. In addition, it is contemplated that adjustment need not be made in all three dimensions. In many cases, scanning and intensity monitoring in one or two dimensions may be sufficient.

Although not illustrated in the flow chart of FIG. 1, the present invention also contemplates a rough alignment subroutine where the adjustable optical components 30 of the optical package are subject to a rough alignment operation by monitoring the intensity of the output of the wavelength conversion device 20 at the native lasing wavelength of the semiconductor laser 10. This aspect of the present invention can be particularly advantageous where it is necessary to ensure that at least some of the light generated by the laser 10 is coupled into the wavelength conversion device 20 before alignment using the wavelength modulated output beam $\lambda_{MOD}$ is initiated.

With the optical components 30 fixed at the optimum coordinates and the wavelength optimized, the optical package can be transitioned to operation in the data projection mode, where an intensity-modulated laser beam is directed from the semiconductor laser 10 to the wavelength conversion device 20. In the data projection mode, the wavelength modulated output beam $\lambda_{MOD}$ is terminated in favor of an intensity-modulated laser beam carrying data to be projected by the optical package. For example, where the optical package is configured for use as part of a scanning laser image projection system, the intensity-modulated laser beam can form a intensity-varying color component of the image to be projected. Of course, further detail concerning the configuration of scanning laser image projection systems and the manner in which varying pixel intensities are generated across an image is beyond the scope of the present invention and may be gleaned from a variety of readily available teachings on the subject.

Although the alignment procedure illustrated in FIG. 1 has been described herein as a procedure that is executed when setting-up the optical package for operation in the data projection mode, it is contemplated that the alignment steps presented in FIG. 1 can be executed at any point in the life cycle of an optical package. For example, referring to the alignment monitoring procedure illustrated in FIG. 2, the alignment steps presented in FIG. 1 can be executed when misalignment is detected during operation in the data projection mode.

Figure 2:
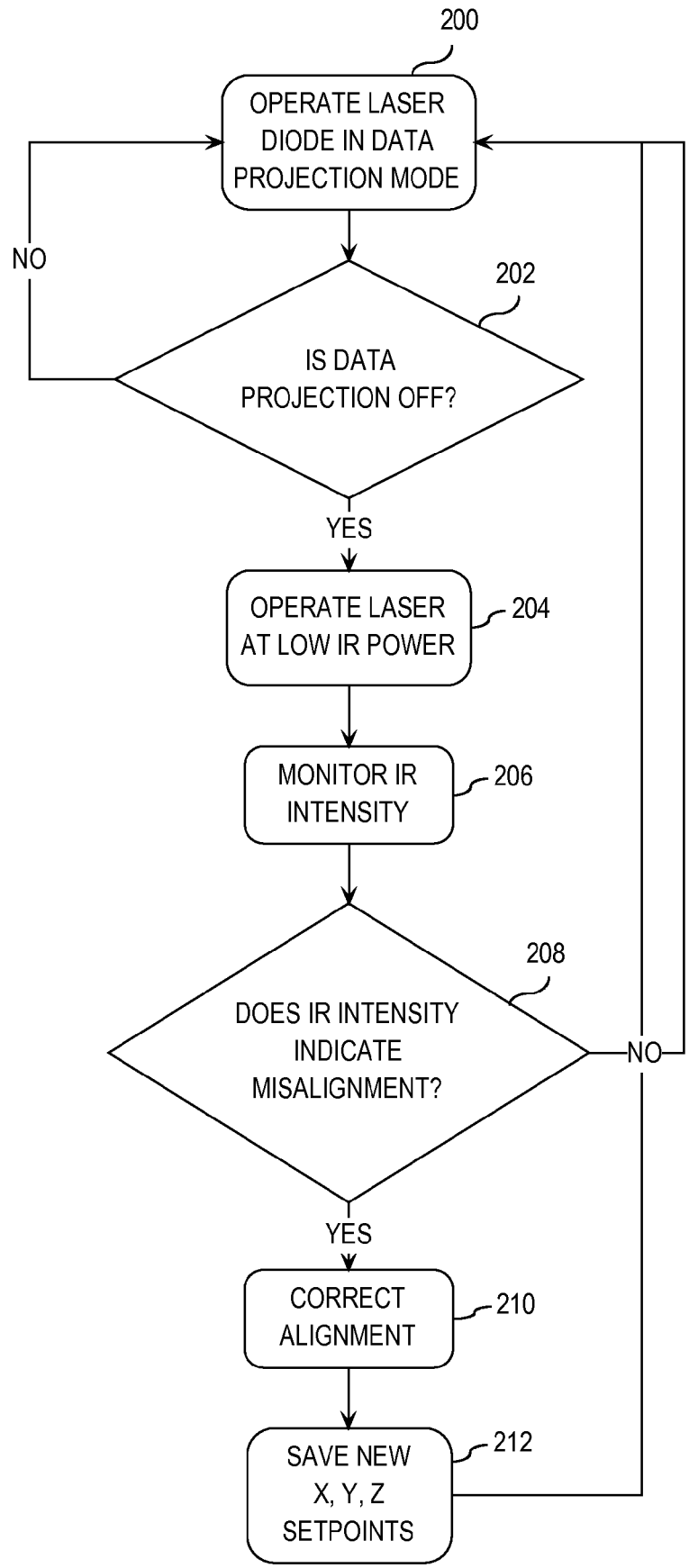
FIG. 2 is a flow chart illustrating a procedure for monitoring and correcting alignment according to another aspect of the present invention.

Specifically, FIG. 2 illustrates a procedure for monitoring and correcting alignment of an intensity-modulated laser beam with the wavelength conversion device 20 during data projection mode (see step 200). According to the illustrated procedure, alignment is only monitored when the intensity-modulated laser beam is not carrying projection data, i.e., during relatively low intensity periods of the intensity-modulated laser beam (see step 202). For example, in the context of a pixel-based laser projection system, the intensity-modulated laser beam is typically scanned through a plurality of display pixels and the modulation of the intensity-modulated laser beam represents display pixel intensity. During scanning, the intensity-modulated laser beam is typically scanned from a transitional display pixel at the end of one row of pixels to a transitional display pixel at the beginning of another row of pixels at a relatively low intensity. This type of scanning behavior is commonly referred to as image projector fly-back. This type of fly-back transition typically accounts for a few microseconds at the end of each image line and a few milliseconds at the end of each frame. During these fly-back periods, the laser 10 can be transitioned to low output intensity and used to monitor alignment within the optical package (see step 204). The conversion efficiency of the wavelength conversion device 20 is extremely low when the laser 10 is operated at low power. Accordingly, this aspect of the present invention is particularly advantageous because the intensity can be monitored without interference by the intensity-modulated, frequency-converted light that would otherwise be generated by the wavelength conversion device 20. As a result, little or no frequency-converted light is generated during fly-back and the intensity sensor 40 can be used to monitor the intensity of the native lasing wavelength of the laser 10 at the output of the wavelength conversion device 20, without significant interference from frequency-converted light (see step 206).

When the intensity of the laser 10 operating at its native lasing wavelength is low enough, the output of the wavelength conversion device 20 will be dominated by the native lasing wavelength of the semiconductor laser 10. In this mode of operation, alignment can be monitored by monitoring the intensity of the native lasing wavelength at the output of the wavelength conversion device 20 (see step 208). When a threshold level of misalignment is indicated in the output of the wavelength conversion device 20, operation of the laser 10 in the data projection mode can be terminated in favor of the wavelength modulated mode of operation described above with reference to FIG. 1 (see step 210). In the alignment mode, the wavelength of output beam is modulated to create updated X, Y, and Z setpoints according to the general methodology illustrated herein with reference to FIG. 1 (see step 212).

Although the present invention is not limited to use of control algorithms, it also contemplates routines for monitoring alignment when the intensity-modulated laser beam is carrying projection data, i.e., without reliance on the aforementioned low intensity fly-back periods of the intensity-modulated laser beam. To do so, it would typically be best to ensure that the optical package has been aligned at set-up, e.g., using the routines set forth herein with reference to FIG. 1. With the optical package already near its peak alignment, one can monitor alignment during data projection by identifying larger than expected variations in the wavelength converted output intensity. For example, in the case of a wavelength-converted green laser operating in data projection mode, one could expect changes in output intensity on the order of less then about 2%. Intensity changes beyond this threshold could be used to transition the optical package to an alignment mode. In the alignment mode, the monitored intensity can be used in the direct adjustment of the optical components in the package. Alternatively, the monitored intensity can be used as a trigger for initiating re-alignment.

The adjustable optical component illustrated schematically in FIG. 3 can take a variety of conventional or yet to be developed forms. For example, it is contemplated that the adjustable optical component 30 may comprise one or more movable micro-opto-electromechanical mirrors, or other MEMS or MOEMS devices, that are configured and arranged to vary the position of the modulated output beam $\lambda_{MOD}$ on the input face of the wavelength conversion device 20 by steering the modulated output beam $\lambda_{MOD}$. Alternatively, the adjustable optical component 30 may comprise one or more liquid lens components that are configured for beam steering and focus adjustment. Still further, it is contemplated that the adjustable optical component 30 may comprise one or more lenses mounted to micro-actuators for beam steering and focus adjustment.

More specifically, although the adjustable optical components 30 are illustrated in FIG. 3 as a relatively simple movable mirror, it is contemplated that the adjustable optical components 30 may take a variety of forms including, but not limited to one or more axially, rotatably, or tiltably adjustable lenses or mirrors, or combinations thereof. In addition, it is contemplated that the adjustable optical components 30 can be configured such that their optical properties can be adjusted without the need for physically moving the component, as would be the case for tunable liquid lenses.

Where the adjustable optical components comprise movable, micro-opto-electromechanical mirrors, the mirrors can be designed to decrease sensitivity to vibrations in the optical package by limiting the range of the deflection angle defined by the mirrors to values on the order of about 1 or 2 degrees, allowing the mirrors to be designed with relatively stiff flexures. Indeed, the present inventors have recognized that a range of one to two degrees is enough to cover lateral beam spot misalignments on the order of 50 to 100 microns.

Where the adjustable optical components comprise one or more liquid lens components, it will typically be desirable to incorporate one more thermal lensing algorithms in the programmable control scheme to account for thermal variation of the optical properties of the liquid lens components.

Although the present invention has been described with reference to pixel-based projection systems, it is contemplated that other projection systems, such as spatial light modulator based systems (including digital light processing (DLP), transmissive LCD, and liquid crystal on silicon (LCOS)), incorporating laser-based light sources may benefit from the alignment techniques described herein.

It is to be understood that the preceding detailed description of the invention is intended to provide an overview or framework for understanding the nature and character of the invention as it is claimed. It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

For the purposes of defining and describing the present invention, it is noted that reference herein to values that are "on the order of" a specified magnitude should be taken to encompass any value that does not vary from the specified magnitude by one or more orders of magnitude. In addition, recitations herein of a component of the present invention being "configured" in a particular way or to embody a particular property or function, are structural recitations as opposed to recitations of intended use. For example, references herein to an adjustable optical component "configured" to optically couple two elements in a particular manner denotes an existing physical condition of the adjustable optical component and, as such, is to be taken as a definite recitation of structural characteristics.

It is noted that terms like "preferably," "commonly," and "typically," when utilized herein, are not intended to limit the scope of the claimed invention or to imply that certain features are critical, essential, or even important to the structure or function of the claimed invention. Rather, these terms are merely intended to highlight alternative or additional features that may or may not be utilized in a particular embodiment of the present invention.

What is claimed is:

1. A method of controlling an optical package comprising a semiconductor laser, a wavelength conversion device, one or more adjustable optical components configured to optically couple the output of the semiconductor laser with an input face of the wavelength conversion device, and an intensity sensor configured to monitor intensity variations of a wavelength-converted output $\lambda_{CONV}$ of the wavelength conversion device, the method comprising:

operating the semiconductor laser to generate a wavelength-modulated output beam $\lambda_{MOD}$ that is modulated over a range of wavelengths encompassing a substantial portion of a FWHM conversion efficiency bandwidth of the wavelength conversion device;

directing the modulated output beam $\lambda_{MOD}$ towards the input face of the wavelength conversion device;

operating the adjustable optical components to vary the position of the modulated output beam $\lambda_{MOD}$ on the input face of the wavelength conversion device, wherein the frequency at which the output beam of the laser is modulated as the position of the modulated output beam $\lambda_{MOD}$ is varied is high enough to ensure that the output beam cycles through a complete modulation frequency range $\Delta f$ at least once for each pass across a waveguide portion of an input face of the wavelength conversion device;

monitoring the intensity variations of a wavelength-converted output $\lambda_{conv}$ of the wavelength conversion device as the output beam of the laser is modulated over the range of wavelengths and as the position of the modulated output beam $\lambda_{MOD}$ on the input face of the wavelength conversion device is varied;

correlating a maximum value of the monitored intensity variations of the wavelength-converted output $\lambda_{CONV}$ with optimum coordinates representing the position of the modulated output beam $\lambda_{MOD}$ on the input face of the wavelength conversion device;

terminating the variation of the position of the modulated output beam $\lambda_{MOD}$ on the input face of the wavelength conversion device by using the optimum coordinates to fix the adjustable optical components, at least temporarily; and operating the optical package in a data projection mode by directing an intensity-modulated laser beam from the semiconductor laser to the wavelength conversion device using the optimum positional coordinates for the adjustable optical components.

2. A method of controlling an optical package as claimed in claim 1 wherein the frequency at which the output beam of the laser is modulated is significantly greater than the frequency at which the position of the modulated output beam is varied across the input face of the wavelength conversion device.

3. A method of controlling an optical package as claimed in claim 1 wherein:
the position of the modulated output beam $\lambda_{MOD}$ on the input face of the wavelength conversion device includes X and Y components; and
the maximum value of the monitored intensity variations of the wavelength-converted output $\lambda_{CONV}$ is correlated with either the X or Y component of the optimum position coordinates prior to correlation with the remaining component.

4. A method of controlling an optical package as claimed in claim 1 wherein:
the position of the modulated output beam $\lambda_{MOD}$ on the input face of the wavelength conversion device includes X, Y, and Z components; and
the X and Y components represent the position of the modulated output beam $\lambda_{MOD}$ in the plane of the input face, while the Z component represents the focus of the output beam $\lambda_{MOD}$ in the plane of the input face.

5. A method of controlling an optical package as claimed in claim 1 wherein the method of controlling the optical package is executed when setting-up the optical package for operation, prior to operation of the optical package in the data projection mode or when a misalignment is indicated during operation in the data projection mode.

6. A method of controlling an optical package as claimed in claim 1 wherein the optical package is transitioned to an alignment mode upon detection of a variation in the wavelength converted output intensity of the wavelength conversion device beyond a misalignment threshold representing a point at which operation in the data projection mode creates larger than expected variations in the wavelength converted output intensity.

7. A method of controlling an optical package as claimed in claim 1 wherein the method of controlling the optical package comprises monitoring alignment of the intensity-modulated laser beam and the wavelength conversion device during the data projection mode.

8. A method of controlling an optical package as claimed in claim 7 wherein alignment is monitored during a relatively low intensity portion of the intensity-modulated laser beam.

9. A method of controlling an optical package as claimed in claim 8 wherein the intensity of the relatively low intensity portion of the intensity-modulated laser beam is such that the output of the wavelength conversion device is dominated by the native lasing wavelength of the semiconductor laser.

10. A method of controlling an optical package as claimed in claim 9 wherein the alignment is monitored by monitoring the intensity of the native lasing wavelength at the output of the wavelength conversion device.

11. A method of controlling an optical package as claimed in claim 10 wherein the method comprises terminating operation of the laser in the data projection mode and re-initiating operation of the semiconductor laser to generate the wavelength modulated output beam $\lambda_{MOD}$ when the intensity of the native lasing wavelength at the output of the wavelength indicates misalignment.

12. A method of controlling an optical package as claimed in claim 7 wherein operation in the data projection mode is such that:
the intensity-modulated laser beam is scanned through a plurality of display pixels and the modulation of the intensity-modulated laser beam represents display pixel intensity;
the intensity-modulated laser beam is scanned between selected transitional display pixels at a relatively low intensity to permit transition between the selected pixels; and
alignment is monitored during transition between the selected pixels.

13. A method of controlling an optical package as claimed in claim 1 wherein the adjustable optical components are subject to a rough alignment operation by monitoring the intensity of the output of the wavelength conversion device at the native lasing wavelength of the semiconductor laser.

14. A method of controlling an optical package as claimed in claim 1 wherein the adjustable optical components are operated to vary the position of the modulated output beam $\lambda_{MOD}$ on the input face of the wavelength conversion device by steering the modulated output beam $\lambda_{MOD}$ through the use of at least one movable micro-opto-electromechanical mirror defining a deflection angle on the order of about 1 or 2 degrees.

15. A method of controlling an optical package as claimed in claim 14 wherein:
the micro-opto-electromechanical mirror is incorporated in a folded-path optical system where the micro-opto-electromechanical mirror is configured to fold the optical path such that it initially passes through an optical lens or lens assembly to reach the mirror and subsequently returns through the optical lens or lens assembly; and
the optical lens or lens assembly is configured for optical magnification on the order of about 1.

16. A method of controlling an optical package as claimed in claim 15 wherein:
the adjustable optical components are operated to vary the position of the modulated output beam $\lambda_{MOD}$ on the input face of the wavelength conversion device by steering the modulated output beam $\lambda_{MOD}$ through the use of one or more liquid lens components; and
the method of controlling the optical package further comprises the application of one or more thermal lensing algorithms to account for thermal variation of the optical properties of the liquid lens components.

17. A method of controlling an optical package as claimed in claim 1 wherein the adjustable optical components are operated to vary the position of the modulated output beam $\lambda_{MOD}$ on the input face of the wavelength conversion device by steering the modulated output beam $\lambda_{MOD}$ through the use of micro-actuators configured to translate the adjustable optical components mechanically.

18. A method of controlling an optical package as claimed in claim 17 wherein the mechanically adjustable optical components are comprised in an optical system comprising additional lens components configured to introduce an optical demultiplication factor into the optical system for decreasing the sensitivity the adjustable optical components to vibration.

19. A laser projection system comprising at least one semiconductor laser, a wavelength conversion device, one or more adjustable optical components configured to optically couple the output of the semiconductor laser with an input face of the wavelength conversion device, an intensity sensor configured to monitor intensity variations of a wavelength-converted output $\lambda_{CONV}$ of the wavelength conversion device, and a laser controller programmed to operate the semiconductor laser wherein the controller is programmed such that at least the following conditions apply to the operation of the semiconductor laser:
upon initiation of a set-up operation, the semiconductor laser generates a wavelength-modulated output beam $\lambda_{MOD}$ that is modulated over a range of wavelengths encompassing a substantial portion of a FWHM conversion efficiency bandwidth of the wavelength conversion device;

the modulated output beam $\lambda_{MOD}$ is directed towards the input face of the wavelength conversion device;

the adjustable optical components are operated to vary the position of the modulated output beam $\lambda_{MOD}$ on the input face of the wavelength conversion device, wherein the frequency at which the output beam of the laser is modulated as the position of the modulated output beam $\lambda_{MOD}$ is varied is high enough to ensure that the output beam cycles through a complete modulation frequency range $\Delta f$ at least once for each pass across a waveguide portion of an input face of the wavelength conversion device;

the intensity variations of a wavelength-converted output $\lambda_{CONV}$ of the wavelength conversion device is monitored by the intensity sensor as the output beam of the laser is modulated and as the position of the modulated output beam $\lambda_{MOD}$ on the input face of the wavelength conversion device is varied;

a maximum value of the monitored intensity variations of the wavelength-converted output $\lambda_{CONV}$ is correlated with optimum coordinates representing the position of the modulated output beam $\lambda_{MOD}$ on the input face of the wavelength conversion device;

the variation of the position of the modulated output beam $\lambda_{MOD}$ on the input face of the wavelength conversion device is terminated, at least temporarily terminating the set-up operation; and operation in a data projection mode is initiated by directing an intensity-modulated laser beam from the semiconductor laser to the wavelength conversion device using the optimum positional coordinates for the adjustable optical components.

* * * * *

UNITED STATES PATENT AND TRADEMARK OFFICE
CERTIFICATE OF CORRECTION

| | |
|---|---|
| PATENT NO. | : 7,756,170 B2 |
| APPLICATION NO. | : 11/880386 |
| DATED | : July 13, 2010 |
| INVENTOR(S) | : Etienne Almoric et al. |

It is certified that error appears in the above-identified patent and that said Letters Patent is hereby corrected as shown below:

| No. | Col. | Line | Description |
|---|---|---|---|
| 1 | 10 | 17 | Currently reads --of at least one movable micro-opto-electromechanical minor--, should read --of at least one movable micro-opto-electromechanical mirror-- |
| 2 | 10 | 22 | Currently reads --the micro-opto-electromechanical minor is incorporated in--, should read --the micro-opto-electromechanical mirror is incorporated in-- |
| 3 | 10 | 26 | Currently reads --lens assembly to reach the minor and subsequently--, should read --lens assembly to reach the mirror and subsequently-- |

Signed and Sealed this
Twenty-third Day of August, 2011

David J. Kappos
*Director of the United States Patent and Trademark Office*